United States Patent
Takahashi

(10) Patent No.: US 7,449,750 B2
(45) Date of Patent: Nov. 11, 2008

(54) SEMICONDUCTOR PROTECTION DEVICE

(75) Inventor: Yukio Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 539 days.

(21) Appl. No.: 11/151,357

(22) Filed: Jun. 14, 2005

(65) Prior Publication Data
US 2005/0274963 A1 Dec. 15, 2005

(30) Foreign Application Priority Data
Jun. 15, 2004 (JP) ............................. 2004-177588

(51) Int. Cl.
H01L 23/62 (2006.01)
(52) U.S. Cl. ...................... 257/355; 257/360
(58) Field of Classification Search .................. 257/355, 257/360
See application file for complete search history.

(56) References Cited

U.S. PATENT DOCUMENTS 5,530,271 A * 6/1996 Fallica ......................... 257/173

FOREIGN PATENT DOCUMENTS

JP 6-120412 A 4/1994

* cited by examiner

Primary Examiner—Roy K Potter
(74) Attorney, Agent, or Firm—Sughrue Mion, PLLC

(57) ABSTRACT

A semiconductor protection device for efficiently protecting internal circuits in semiconductor integrated circuits wherein an N-type diffusion layer is formed to enclose a $P^+$ doped diffusion layer. The breakdown voltage of the parasitic diode connected to the collector electrode is consequently set lower than the breakdown voltage of the diode connected to the emitter voltage due to the increase in the concentration of N-type impurities around the parasitic diode from the forming of the N-type diffusion layer. In other words, the diode breakdown voltage is determined by the high or low concentration of impurities around the applicable diode so that the higher concentration of impurities, the lower the breakdown voltage. The clamping of the parasitic diode connected between the high voltage potential supply and the low voltage potential supply is therefore boosted to make electrical current flow more easily in the reverse direction so that damage to internal circuits from static electricity applied to the power supply terminals can be prevented.

8 Claims, 5 Drawing Sheets

US 7,449,750 B2

SEMICONDUCTOR PROTECTION DEVICE

BACKGROUND OF THE INVENTION

1. Field of the Invention

The present invention relates to a protection device and more particularly to a semiconductor protection circuit for protecting semiconductor integrated circuits (LSI) from damage occurring due to static electricity, etc.

2. Description of Related Art

In the related art, a protection circuit was formed in the vicinity of the LSI chip for the purpose of preventing damage to the internal components of the LSI due to static electricity applied from external sections. FIG. 6 is drawings showing an example of the protective device of the related art. FIG. 6A is a circuit diagram of the related art. FIG. 6B and FIG. 6C are flat views of the PNP bipolar transistor 120 of the related art. FIG. 6D is a cross sectional view taken-along lines A-A' shown in FIG. 6C and FIG. 6B. The protection circuit for the I/O pad 1 as the example shown in FIG. 6A, is made up of a PNP bipolar transistor 20. The emitter (E) of the PNP bipolar transistor 20 connects to the I/O pad 1, the base (B) connects to the high voltage potential supply (VDD) 2, and the collector (C) connects to the low voltage potential supply (VSS) 3. The protection circuit for the high voltage potential supply (VDD) 2 is made up of a power supply diode 22. The anode of the power supply diode 22 connects to the high voltage potential supply (VDD) and the cathode connects to the low voltage potential supply (VSS) 3.

The PNP bipolar transistor 20 is described next. As shown in FIG. 6D, component isolation regions 12 such as a field oxidation film are selectively formed on the surface of the P-type substrate 11. An N well 13 is formed on the surface region of the P-type substrate 11. A P$^+$ diffusion layer 14a connected with the I/O pad 1, and a P$^+$ diffusion layer 14b connected to the low voltage potential supply (VSS) 3 are formed on one of the surface regions of the N well 13 isolated by the component isolation regions 12. An N$^+$ diffusion layer 15 connecting to the high voltage potential supply (VDD) 2 is formed on the other surface region of the N well 13.

When-positive static electricity is applied to the I/O pad 1, in the case of this protection circuit, the snapback operation of the PNP bipolar transistor 20 causes a current to flow from the P$^+$ diffusion layer 14a connected to the I/O pad 1, to the P$^+$ diffusion layer 14b connected to the low voltage potential supply (VSS) 3, and this electrical current protects the internal circuit 21. When negative static electricity is applied to the I/O pad 1, the breakdown operation of the parasitic diode 23 of the PNP bipolar transistor 20 causes a current to flow from the P$^+$ diffusion layer 14a connected to the I/O pad 1, to the N$^+$ diffusion layer 15 connected to the high voltage potential supply (VDD) 2, and this electrical current protects the internal circuit 21. When positive static electricity is applied to the high voltage potential supply (VDD) 2, the breakdown operation of the power supply diode (power supply Di) 22, causes a current to flow to the P$^+$ diffusion layer 14b connected to the low voltage potential supply (VSS) 3, and this electrical current protects the internal circuit 21.

FIG. 7 is a drawing showing the chip layout of the semiconductor integrated circuit (LSI: Large Scale Integrated Circuit). The protection circuit for each terminal is formed in the vicinity of that terminal. The high voltage potential supply (VDD) 2, the low voltage potential supply (VSS) 3, and the I/O pad 1 are optional and vary according to each product.

However, the technology of the related art described in JP-A NO. 120412/1994 had no room for improvement in the following points.

When the power supply pad positions were separated by a particular distance from the high voltage potential supply (VDD) and low voltage potential supply (VSS) in the semiconductor integrated circuit, the other side of the power supply wiring for the power supply protection circuit formed hear that power supply pad became extremely long. So that in some cases the power-supply wiring resistance reached a large value of several dozen ohms. Also, the circuit and layout were designed for an extremely low wiring resistance of less than 1 ohm as a countermeasure to power supply fluctuations in power supplied to the internal circuit. When positive static electricity was applied to a power supply terminal such as for the high voltage potential supply (VDD), the voltage rise across the power supply wiring resistors (R1, R2) connected to the power supply diode could not be ignored, and the current clamping ability of the power supply diode dropped drastically.

Here, since the breakdown voltage of the parasitic diode connected to the collector electrode and the breakdown voltage of the diode connected to the emitter electrode were designed to be the same figure, positive static electricity applied to a power supply terminal such as the high voltage potential supply (VDD), then flowed to the small internal circuit made up of the power supply wiring resistors. The related art therefore had the problem that internal circuits might sustain damage from low voltage static electricity and so there is still room for further improvement.

One method to eliminate the above problem, utilized the low resistance of the power supply wiring resistors (R1, R2) connected to the power supply diodes. However on a product where the high voltage potential supply (VDD) and low voltage potential supply (VSS) power supply pad positions were separated by several millimeters, a wiring resistance width of several hundred micrometers was required. This larger wiring resistance width led to a large chip size and cost increases so the related art still required further improvement. Another method to resolve the above problems, added a power supply diode however this method also led to a large chip size and cost increases and so the related art still requires further improvement.

SUMMARY OF THE INVENTION

A protection device to protect an internal circuit of the present invention comprises:

a first power source line; a second power source line; a signal line coupled to the internal circuit; a bipolar transistor having its current path between the first power source line and the signal line and its control node coupled to the first power source line; a first parasitic diode coupled between the first power source line and the signal line and having a first breakdown voltage; and a second parasitic diode coupled between the first and second power source line and having a second breakdown voltage lower than the first breakdown voltage.

A protection device to protect an internal circuit of the present invention includes:

a first power source line; a second power source line; a signal line coupled to the internal circuit; a semiconductor well of a first conductivity type; a first diffusion region of the first conductivity type formed on the semiconductor well and coupled to the first power source line; a second diffusion region of a second conductivity type formed on the semiconductor well and coupled to the signal line; a third diffusion region of the second conductivity type formed on the semiconductor well and coupled to the second power source line; and a fourth diffusion region of the first conductivity type formed between the third diffusion region and the semiconductor well to form a parasitic diode with the third and fourth diffusion regions;

wherein an impurity concentration of the fourth diffusion region is larger than that of the semiconductor well.

BRIEF DESCRIPTION OF THE DRAWINGS

The above and other objects as well as advantages of the present invention will become clear by the following description of the preferred embodiments of the present invention with reference to the accompanying drawings, wherein.

DETAILED DESCRIPTION OF THE PREFERRED EMBODIMENTS

Figure 1A:
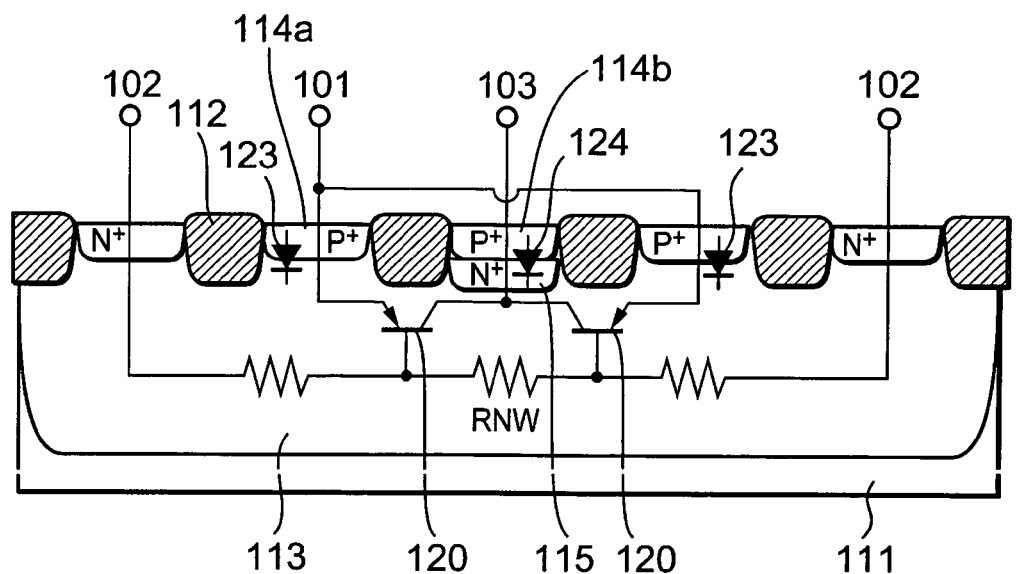
FIG. 1A is a drawing showing the semiconductor integrated circuit (LSI) of the present embodiment.

The embodiments of this invention are described next while referring to the accompanying drawings. In all the drawings, identical structural elements are assigned the same reference numerals and their description is omitted.

Figure 1B:
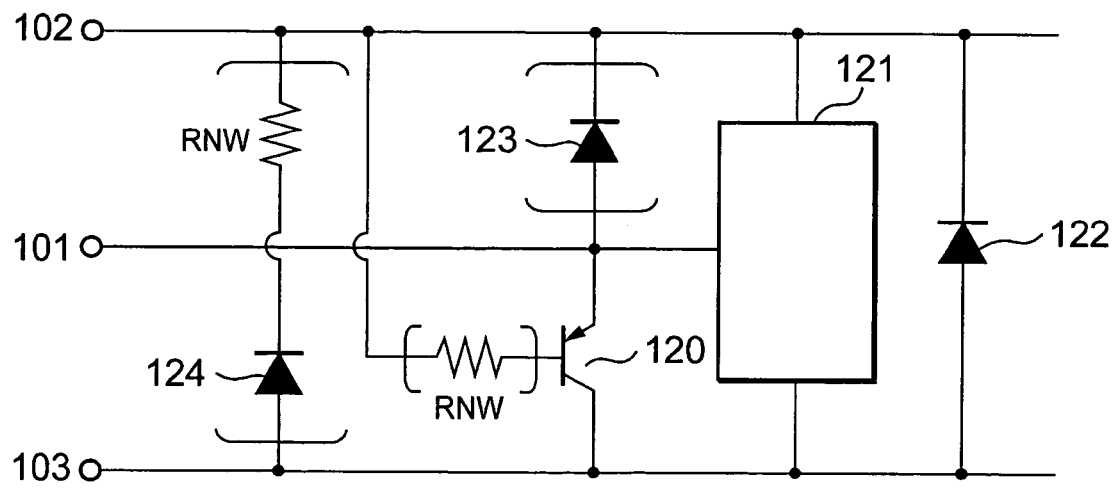
FIG. 1B is a circuit diagram of the protection circuit and internal circuit in the present embodiment.

FIG. 1A is a cross sectional drawing showing a PNP bipolar transistor 120 of the present embodiment. FIG. 1B is a circuit diagram of the present embodiment.

The PNP bipolar transistor 120 is comprised of a P-type substrate 111, an N-type well 113 formed on the surface region of the P-type substrate 111, and a component isolation region 112 such as a field oxidation film formed on the surface of the P-type substrate 111.

A P⁺ diffusion layer 114a connecting to the I/O pad 101, and a P⁺ diffusion layer 114b connecting to the low voltage potential supply (VSS) 103 are formed on one surface region of the N well 113 isolated by the component isolation regions 112. An N-type diffusion layer 115 connecting to the high voltage potential supply (VDD) 102 is formed on the other surface region of the N well 113. The N-type diffusion layer 115 is formed so as to enclose the P⁺ diffusion layer 114b connecting to the low voltage potential supply (VSS). The forming of the N-type diffusion layer 115 here, lowers the breakdown voltage of the parasitic diode 124 described later, and when static electricity is applied to a power terminal such as a high voltage potential supply 102, the electrical current flows to low voltage potential supply 103. An internal circuit 121 can therefore be efficiently protected from static electricity applied to a power supply terminal such as the high voltage potential supply 102.

The protection circuit for the I/O pad 101 is made up of the PNP bipolar transistor 120. The emitter electrode (E) of the PNP bipolar transistor 120 connects to the I/O pad 101, the base electrode (B) connects to the high voltage potential supply (VDD) 102, and the collector electrode (C) connects to the low voltage potential supply (VSS) 103. The protection circuit for the high voltage potential supply (VDD) 102 is comprised from a power supply protective diode 122 as a protective diode for the power supply terminal. The anode (of diode 122) connects to the high voltage potential supply (VDD) 102 and the cathode connects to the low voltage potential supply (VSS) 103.

The N-type diffusion layer 115 is formed by adding to the already known processes for fabricating the PNP bipolar transistor. In a process for example with a mix of both low voltage and high voltage devices, the diffusion layer formed in the N-type offset region of the high voltage N-channel type transistor can be substituted. In a process where an N-type depression transistor or a depression-type capacitor is added, the N-type diffusion layer formed beneath its gate oxidized film can be substituted. An internal circuit 121 can therefore be efficiently protected from static electricity applied to a power supply terminal such, as the high voltage potential supply 102 without increasing the number of processes.

By forming the N-type diffusion layer 115 so as to enclose the P⁺ diffusion layer 114b connecting to the low voltage potential supply (VSS) 103 of PNP bipolar transistor 120, the voltage clamping capacity can be improved and the breakdown voltage of the parasitic diode 124 between the high voltage potential supply (VDD) 102 and the low voltage potential supply (VSS) 103 and connecting to the low voltage potential supply 103 functioning as the collector electrode, can be set lower than the breakdown voltage of the parasitic diode 123 connected to the emitter electrode and formed on the PN diode made from the P⁺ diffusion layer 114a formed in the N-type well 113; as well as the breakdown voltage of the power supply protective diode 122 formed by the PN diode from the P⁺ diffusion layer 114a or P⁺ diffusion layer 114b formed on the N-type well 113. So when static electricity is for example applied to the high voltage potential supply (VDD) 102, the parasitic diode 124 between that high voltage potential supply (VDD) 102 and low voltage potential supply (VSS) 103 easily performs the breakdown operation and electrical current flows to the low voltage potential supply (VSS) 103.

Setting the breakdown voltage of the parasitic diode 124 of PNP bipolar transistor 120 lower than the breakdown voltage of the parasitic diode 123 and the power supply parasitic diode 122, makes the parasitic diode 124 perform breakdown operation, and prevents damage to the internal circuit 121 due to static electricity.

The PNP bipolar transistor 120 that functions as the protection circuit for the I/O pad 101 is designed for each internal circuit so that the power supply wiring resistance connected to the PNP bipolar transistor 120 is smaller than the power supply wiring resistance of the internal circuit and can therefore prevent the problem of a drop in protective clamping capability from occurring due to a voltage increase in the power supply wiring resistance.

There are several dozen I/O pads 101 so an identical number of parasitic diodes 124 (PNP bipolar transistor 120 functioning as the protection circuit for the I/O pad 101) are also formed. The capability for protecting the internal circuit 121 from static electricity input to a power supply terminal such as for the high voltage potential supply (VDD) 102 is therefore improved.

As to the effect of the PNP bipolar transistor 120, in the technology of the related art such as the technology disclosed in JP-A No. 120412/1994, the breakdown voltage of the parasitic diode connected to the collector electrode was the same figure as the breakdown voltage of the parasitic diode connected to the emitter electrode. The static electricity applied to a power supply terminal such as the high voltage potential supply (VDD) therefore flows into the internal circuits having low power supply wiring resistance and the low voltage static electricity might then damage the internal circuits. However, in the PNP bipolar transistor servicing as the protection circuit for the I/O pad 101, there are a parasitic N-type well resistor (RNW) inside an N-type well 113 and a parasitic diode 124 between the high voltage potential supply (VDD) 102 and low voltage potential supply (VSS) 103. An N-type diffusion layer 115 is formed here so as to enclose the P+ diffusion layer 114b connecting to the low voltage potential supply (VSS) 103 of the PNP bipolar transistor 120. The concentration of N-type impurities around the parasitic diode 124 increases due to the forming of the N-type diffusion layer 115 so that the breakdown voltage of the parasitic diode 124 connected to the collector electrode is set lower than the breakdown voltage of the parasitic diode 123 connected to the emitter voltage. In other words, the diode breakdown voltage is determined by the size of the impurity concentration (N-type, P-type) in the periphery of the applicable diode, and the higher the concentration of impurities the lower the breakdown voltage becomes. Therefore, compared to the parasitic diode 123 connected to the emitter electrode, the electrical current therefore flows easily in the opposite direction of the parasitic diode 124 connected to the collector electrode so that the clamping capability of the parasitic diode 124 connected between the high voltage potential supply (VDD) 102 and low voltage potential supply (VSS) 103 is improved, and damage to the internal circuit 121 from static electricity applied to a power supply terminal such as for the high voltage potential supply can be prevented.

In the technology of the related art, the power supply protective diode 22 formed from a PN diode made up of the P+ diffusion layer 14a and P+ diffusion layer 14b formed within the N-type well 13, is designed to possess the same breakdown voltage as the parasitic diode 24 of the PNP bipolar transistor 20. In contrast, in the present embodiment, the breakdown voltage of the parasitic diode 124 of the PNP bipolar transistor 120 is set to be lower than the breakdown voltage of the power supply protective diode 122 formed of a PN diode comprised of a P+ diffusion layer 114a and P+ diffusion layer 114b so that the parasitic diode 124 will more easily perform breakdown operation, and electrical current will flow to the low voltage potential supply (VSS) 103. Damage to the internal circuit 121 from static electricity can therefore be prevented. Therefore the internal circuit 121 can be efficiently protected by the PNP bipolar transistor 120.

The PNP bipolar transistor 120 that functions as, the protection circuit for the I/O pad 101 is designed for each internal circuit 121 so that the power supply wiring resistance. connecting to the PNP bipolar transistor 120 is smaller than the power supply wiring resistance of the internal circuit 121 and therefore prevents the problem of a drop in, protective clamping capability from occurring due to a voltage increase in the power supply wiring resistors.

There are approximately several dozen I/O pads 101. There is also an equal number of parasitic diodes 124 (of PNP bipolar transistor 120 functioning as the protection circuit for the I/O pad 101) and so the ability to protect the internal circuit 121 from static electricity input to a power supply terminal such as for the high voltage potential supply (VDD) 102 is further improved. The PNP bipolar transistor 120 can therefore protect the internal circuit 121 with even greater efficiency.

The N-type diffusion layer 115 is formed by adding additional processes to the already known processes for fabricating the PNP bipolar transistor 120. In a process for example with a mix of both low voltage and high voltage devices, the diffusion layer formed in the N-type offset region of the high voltage N-channel type transistor can be substituted. In a process for adding an N-type depression transistor or a depressioN-type capacitor, the N-type diffusion layer formed beneath the oxidized film of its gate can be substituted. The internal circuit 121 can therefore be efficiently protected from static electricity applied to a power supply terminal such as the high voltage potential supply 102 without increasing the number of processes. The PNP bipolar transistor 120 can therefore efficiently protect the internal circuit 121.

Second Embodiment

Figure 2:
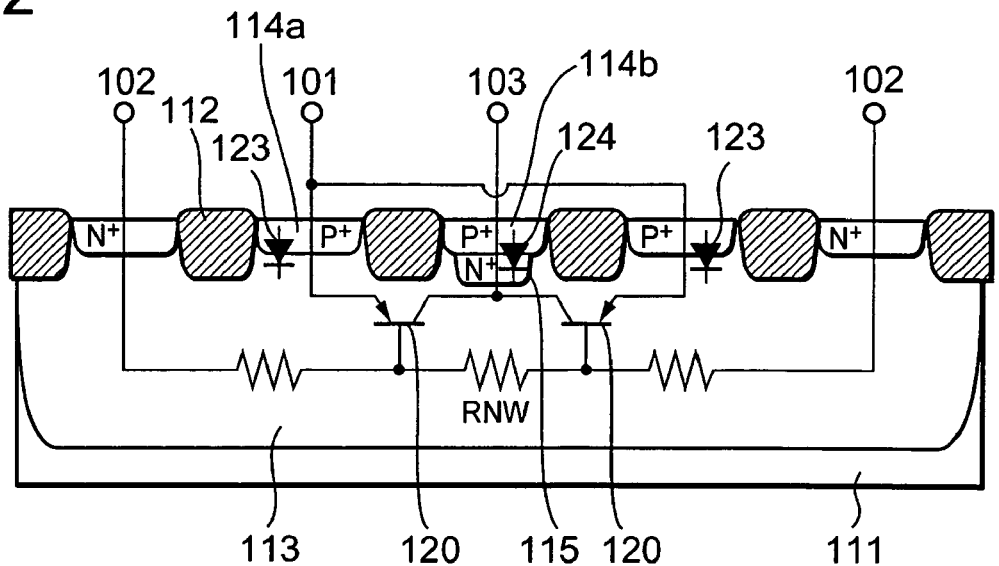
FIG. 2 is a cross sectional view of the semiconductor integrated circuit (LSI) of the present embodiment.

FIG. 2 is a cross sectional view of the PNP bipolar transistor 120 of this embodiment. The circuit diagram is the same as described in FIG. 1B for the first embodiment.

In this embodiment, an N-type diffusion layer 115 is formed so as to enclose the P+ diffusion layer 114b on only a section of the bottom of the P+ diffusion layer 114b connecting to the low voltage potential supply (VSS) 103 of the PNP bipolar transistor 120.

In this embodiment, the N-type diffusion layer 115 is formed on only a section of the bottom of the P+ diffusion layer 114b so the process is largely the same as the doping (impurity) concentration profile between the P+ diffusion layer 114a and P+ diffusion layer 114b. Consequently the operability of the PNP bipolar transistor 120 can be maintained and the capability to protect the internal circuit 121 from static electricity applied to a power supply terminal such as the high voltage potential supply 102 can be improved. The PNP bipolar transistor 120 can therefore efficiently protect the internal circuit 121.

Third Embodiment

Figure 3:
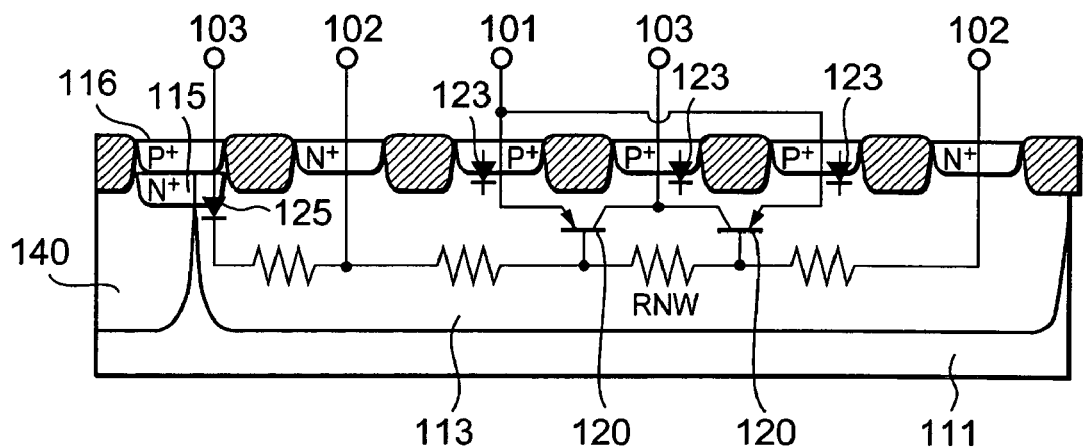
FIG. 3 is a cross sectional view of the semiconductor integrated circuit (LSI) of the present embodiment.

FIG. 3 is a cross sectional view of the PNP bipolar transistor 120 of this embodiment. In this embodiment, a P+ diffusion layer 116 connecting to a low voltage potential supply (VSS) 103 is formed so as to intersect with the outermost circumferential surface of the P-type well 140 and the outermost circumferential surface of the N-type well 113 of the PNP bipolar transistor 120. An N-type diffusion layer 115 is also formed in this embodiment so as to enclose the P+ diffusion layer 116.

The P+ diffusion layer 116 connecting to the low voltage potential supply (VSS) 103 and formed on the outermost circumferential surface of the N-type well 113, is comprised of a parasitic diode 125 and the N-type well 113 connected to the high voltage potential supply (VDD) 102. This parasitic diode 125 further boosts the protection of the internal circuit shown in FIG. 1B from static electricity applied to power supply terminals such as for the high voltage potential supply (VDD) 102, by enhancing the protection circuit at power supply terminals such as for high voltage potential supply (VDD) 102. The PNP bipolar transistor 120 can therefore efficiently protect the internal circuit.

In this embodiment, the guard ring layer (not shown in drawing) of the P+ diffusion layer for enclosing the N-type well 113 is jointly used with the P+ diffusion layer 116 to prevent latchup of the protection circuit with circuits outside the protection circuit. The ability to protect the internal circuit from static electricity applied to power supply terminals such as for the high voltage potential supply (VDD) 102 can therefore be improved without increasing the chip size. The PNP bipolar transistor 120 can therefore efficiently protect the internal circuit, while meeting demands for a small chip size.

In this embodiment, the N-type diffusion layer 115 may also be formed beneath the P+ diffusion layer 114b described in the first and second embodiments. Forming the N-type diffusion layer 115 here can further enhance the capability to protect the internal circuit from static electricity applied to power supply terminals such as for the high voltage potential supply (VDD) 102. The PNP bipolar transistor 120 can therefore efficiently protect the internal circuit.

The embodiments of this invention were described while referring to the drawings. However these are merely examples of this invention and the invention may of course utilize a diverse range of variations or adaptations not described in the embodiments.

Figure 4:
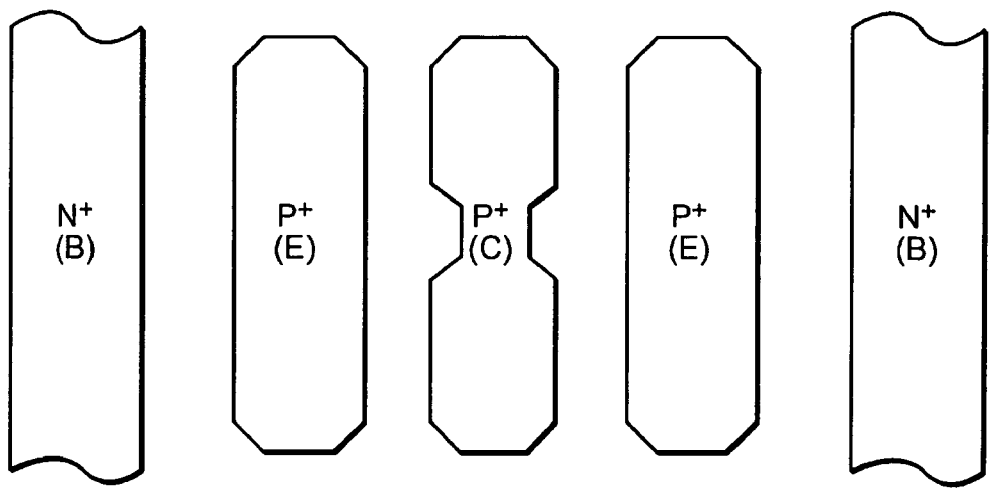
FIG. 4 is a conceptual plan view of the bipolar transistor of the present embodiment.

The above embodiments for example described a P+ diffusion layer 114b. shape that was approximately equivalent to the P+ diffusion layer 114a shape. However as shown by the flat view of the PNP bipolar transistor 120 in FIG. 4, a P+ diffusion layer 114b with sharp angles and connecting to the low voltage potential supply (VSS) 103 of PNP bipolar transistor 120 may be utilized more than P+ diffusion layer 114a connecting to the I/O pad 101 utilizing the P+ diffusion layer 114b with sharp angle, improves the breakdown current drive performance of the parasitic diode formed from the P+ diffusion layer 114b and the N-type diffusion layer 115, and also improves the ability to protect the internal circuit 121 from static electricity applied to power supply terminals such as for the high voltage potential supply (VDD) 102. The PNP bipolar transistor 120 can therefore efficiently protect the internal circuit. Combining with the N-type diffusion layer 115 described in the above circuit can also improve the ability to protect the internal circuit from static electricity applied to power supply terminals such as for the high voltage potential supply (VDD) 102. The PNP bipolar transistor 120 can therefore protect the internal circuit even more efficiently.

Figure 5A:
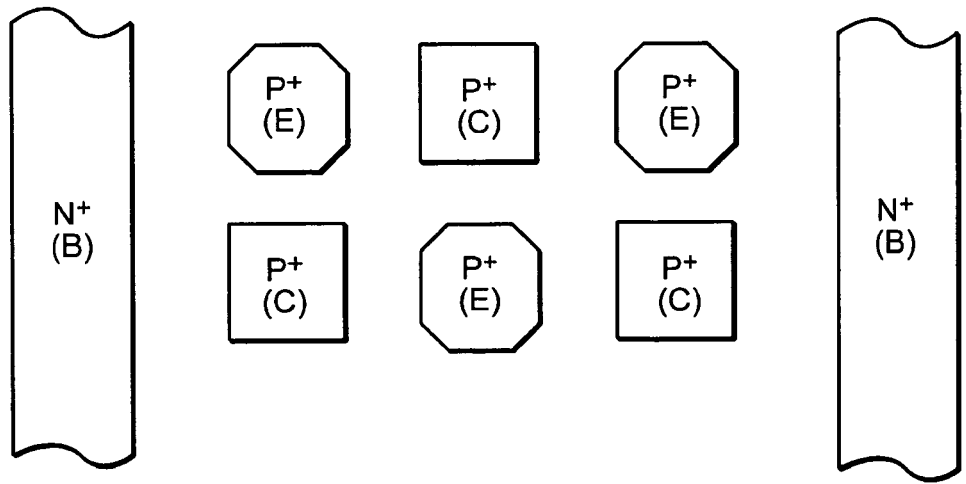
FIGS. 5A to 5C are conceptual plan views of the bipolar transistor of the-present embodiment.
Figure 5B:
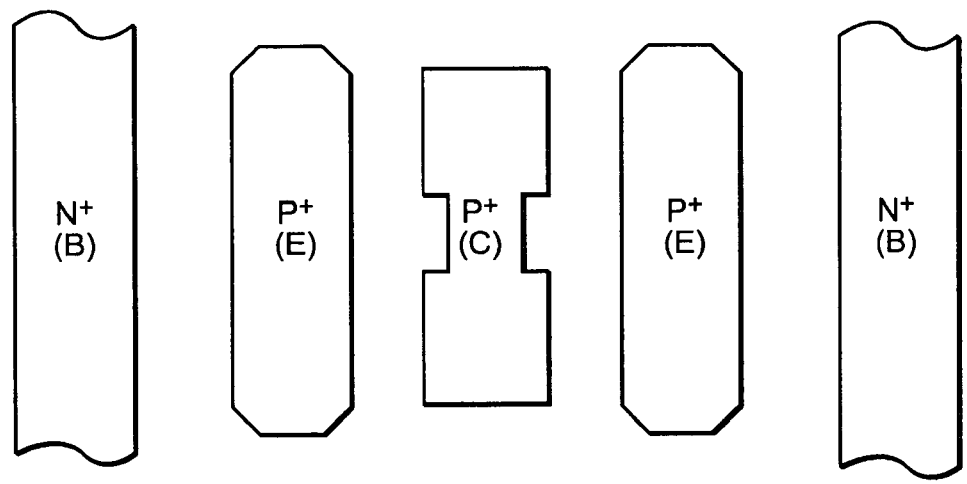
Figure 5C:
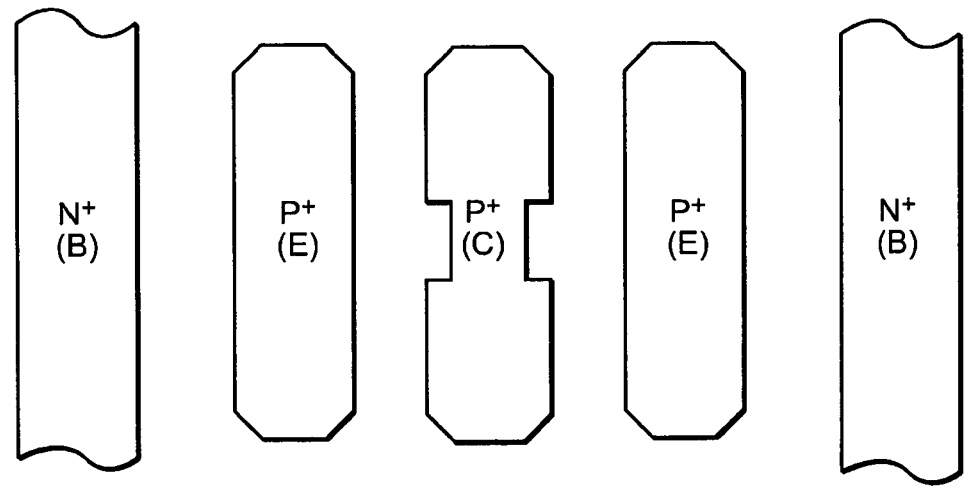
Figure 6A:
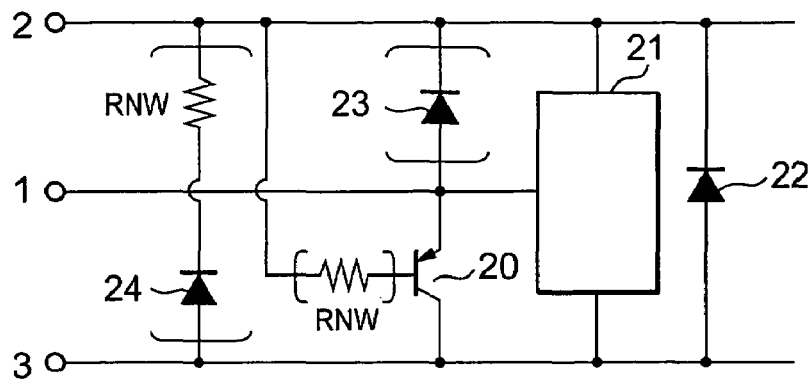
FIGS. 6A to 6D are conceptual diagrams of the semiconductor integrated circuit (LSI) of the related art.
Figure 6B:
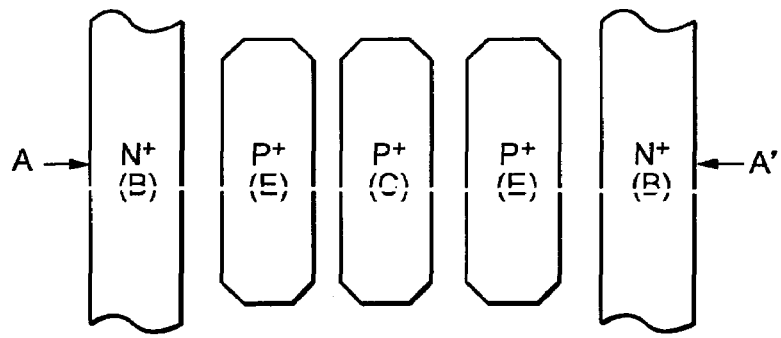
Figure 6C:
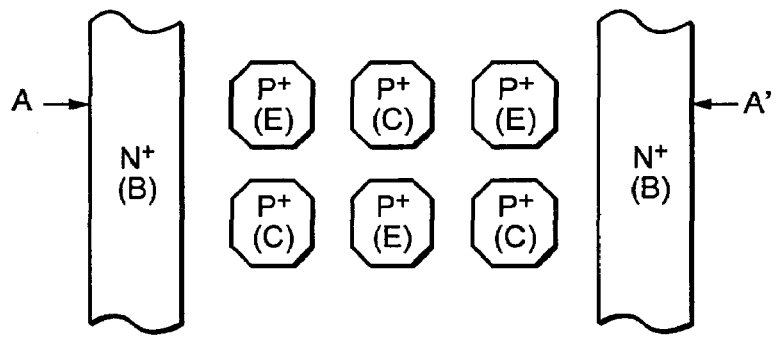
Figure 6D:
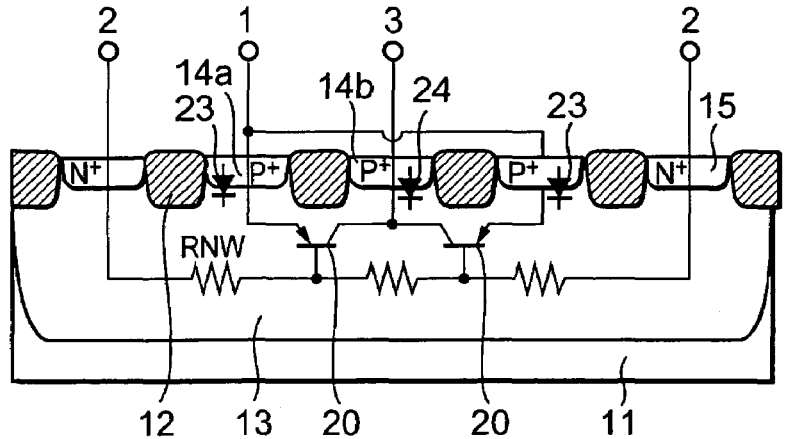
Figure 7:
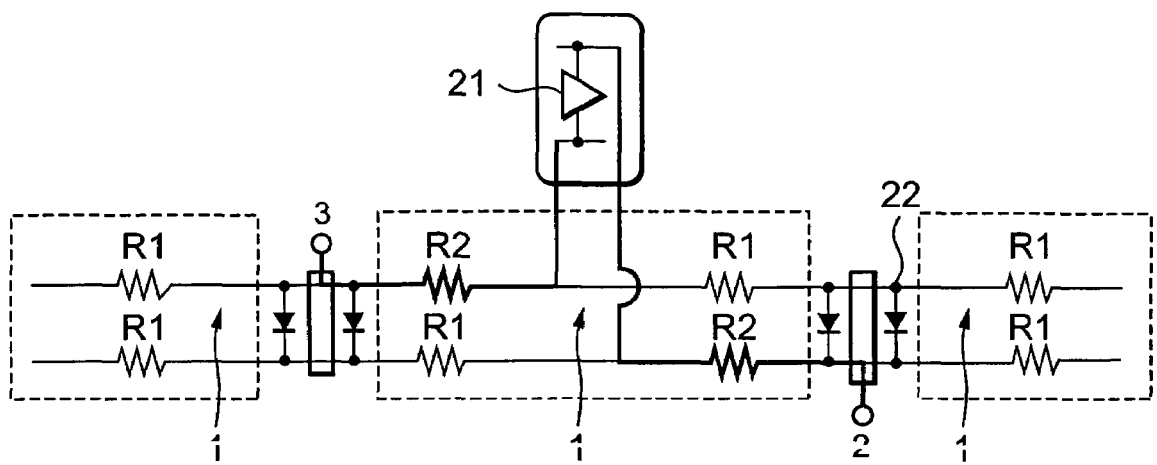
FIG. 7 is a circuit diagram of the related art.

As shown in the flat views in FIG. 5B and FIG. 5C, the chamfer angle of the P+ diffusion layer 114b connected to the low voltage potential supply (VSS) 103 of PNP bipolar transistor 120 and the chamfer angle of the P+ diffusion layer 114a connecting to the I/O pads 101 may be formed at a more acute (sharper) angle. Forming this more acute angle, lowers the breakdown voltage of the parasitic diode made up of the P+ diffusion layer 114b and the N-type diffusion layer 115 and boosts the electrical current drive performance during the parasitic diode breakdown operation, and further improves the ability to protect the internal circuit from static electricity applied to power supply terminals such as for the high voltage potential supply (VDD) 102. The PNP bipolar transistor 120 can therefore protect the internal circuit even more efficiently.

As shown in the flat views in FIG. 5A, the P+ diffusion layer 114b connected to the low voltage potential supply (VSS) 103 of PNP bipolar transistor 120, and the P+ diffusion layer 114a connecting to the I/O pads 101 maybe formed in a cell array. Utilizing a cell array allows forming a comparatively large total number of angles and peripheral length for the P+ diffusion layer 114b and the P-type diffusion layer 114a to boost the electrical current drive performance during the parasitic diode breakdown operation and further improves the ability to protect the internal circuit from static electricity applied to power supply terminals such as for the high voltage potential supply (VDD) 102. The PNP bipolar transistor 120 can therefore protect the internal circuit even more efficiently.

In the above embodiments, the static electricity was described as applied from the high voltage potential supply (VDD) 102. However by making the breakdown voltage of the parasitic diode 124 lower than the breakdown voltage of the parasitic diode 123 and power supply protective diode 122, the breakdown operation of the parasitic diode 124 can be improved, and damage to internal circuits due to static electricity can be prevented even when the static electricity is applied to other power supply terminals such as for the I/O pads 101 and the low voltage potential supply (VSS) 103. The PNP bipolar transistor can therefore protect the internal circuit even more efficiently.

In the above embodiments, using a PNP bipolar transistor 120 as the protection circuit for the internal circuit 121 was described; however, an NPN bipolar transistor may be utilized. In that case, a P+ diffusion is formed touching at least a section on the bottom of the N diffusion layer. The concentration of P-type impurities around the parasitic diode can be raised by increasing the P-type impurity content contained in the P+ diffusion layer so that the breakdown voltage of the parasitic diode connected to the collector electrode can be set lower than the breakdown voltage of the parasitic diode connected to the emitter electrode. In other words, the diode breakdown voltage is determined by the size of the impurity concentration (N-type, P-type) in the periphery of the applicable diode, and the higher the concentration of impurities the lower the breakdown voltage becomes. So compared to the parasitic diode connected to the emitter electrode, the electrical current flows easily in the opposite direction of the parasitic diode connected to the collector electrode. This reverse current flow improves the clamping capability of the parasitic diode and prevents damage to the internal circuit caused by applying static electricity to a power supply terminal such as for the high voltage potential supply, I/O pads, or low voltage potential power supply. The NPN bipolar transistor can therefore efficiently protect the internal circuit. By setting the breakdown voltage of the parasitic diode connected to the collector electrode of the NPN bipolar transistor lower than breakdown voltage of the power supply protective diode, the breakdown operation by the parasitic diode connecting to the collector electrode can be performed more smoothly and electrical current can flow to the low voltage potential supply (VSS). Damage caused by static electricity in the internal circuit can therefore be prevented. The NPN bipolar transistor can therefore protect the internal circuit even more efficiently.

As the above mentioned, the breakdown voltage of the parasitic diode connecting to the collector electrode is lower than the breakdown voltage of the parasitic diode connecting to the emitter electrode so that when static electricity is applied to the power supply terminal, electrical current tends to easily flow in a direction opposite that of the parasitic diode connected to the collector electrode. Electrical current can therefore be prevented from flowing into the semiconductor circuit when static electricity is applied to the power supply terminal. Therefore damage to the semiconductor circuit due to static electricity can be efficiently prevented, and the internal circuit can be efficiently protected.

What is claimed is:

1. A protection device to protect an internal circuit comprising:
   a first power source line;
   a second power source line;
   a signal line coupled to said internal circuit;
   a bipolar transistor having its current path between said second power source line and said signal line and its control node coupled to said first power source line;
   a first parasitic diode coupled between said first power source line and said signal line and having a first breakdown voltage; and
   a second parasitic diode coupled between said first and second power source line and having a second breakdown voltage lower than said first breakdown voltage;

wherein said first parasitic diode has a first diffusion region of a first conductivity type formed over a semiconductor well of a second conductivity type, wherein said second parasitic diode has a second diffusion region of said first conductivity type formed over said semiconductor well and a third diffusion region of said second conductivity type formed between second diffusion region and said semiconductor well, wherein impurity concentration of said second diffusion region is larger than that of said semiconductor well.

2. The protection circuit as claimed in claim 1, wherein said second parasitic diode is formed at a collector region of said bipolar transistor.

3. The protection device as claimed in claim 1, wherein said second parasitic diode is formed' at a guard ling region other than a collector region of said bipolar transistor.

4. A protection device to protect an internal circuit, comprising:
   a first power source line;
   a second power source line;
   a signal line coupled to said internal circuit;
   a semiconductor well of a first conductivity type;
   a first diffusion region of said first conductivity type formed on said semiconductor well and coupled to said first power source line;
   a second diffusion region of a second conductivity type formed on said semiconductor well and coupled to said signal line;
   a third diffusion region of said second conductivity type formed on said semiconductor well and coupled to said second power source line; and
   a fourth diffusion region of said first conductivity type formed between said third diffusion region and said semiconductor well to form a parasitic diode with said third and fourth diffusion regions
   wherein an impurity concentration of said fourth diffusion region is larger than that of said semiconductor well.

5. The protection device as claimed in claim 4, wherein said second, third and fourth diffusion regions are arranged to form a bipolar transistor.

6. The protection device as claimed in claim 4, said protection device further including a fifth diffusion region of said second conductivity type formed on said semiconductor well;
   wherein said second and fifth diffusion regions are arranged to form a bipolar transistor;
   wherein said third and fourth diffusion regions are arranged apart from said second and fifth diffusion regions.

7. The protection device as claimed in claim 4, wherein said first conductivity type is a N type and said second conductivity type is a P type.

8. The protection device as claimed in claim 4, wherein said first conductivity type is a P type and said second conductivity type is a N type.

* * * * *